United States Patent
O'Connell et al.

[11] Patent Number: 5,157,284
[45] Date of Patent: Oct. 20, 1992

[54] INTEGRATED CIRCUIT INCLUDING AN INPUT BUFFER CIRCUIT HAVING NAND AND NOR GATES

[75] Inventors: Cormac M. O'Connell, Kanata, Canada; Peter H. Voss, San Jose, Calif.

[73] Assignee: U.S. Philips Corp., New York, N.Y.

[21] Appl. No.: 724,099

[22] Filed: Jul. 1, 1991

[30] Foreign Application Priority Data

Jul. 2, 1990 [NL] Netherlands ............... 9001500

[51] Int. Cl.$^5$ ........................................... H03K 19/00
[52] U.S. Cl. ........................... 307/463; 365/189.05
[58] Field of Search ............ 307/463, 440, 443, 445; 365/189.05

[56] References Cited

U.S. PATENT DOCUMENTS

| | | | |
|---|---|---|---|
| 4,630,239 | 12/1986 | Reed et al. | 365/203 |
| 4,807,198 | 2/1989 | Flannagan et al. | 365/189.05 |
| 4,841,488 | 6/1989 | Sanada | 365/189.01 |
| 4,907,203 | 3/1990 | Wada et al. | 365/189.03 |
| 4,985,644 | 1/1991 | Okihara et al. | 365/189.05 |

Primary Examiner—Robert J. Pascal
Attorney, Agent, or Firm—Steven R. Biren

[57] ABSTRACT

Using a NAND and a NOR gate as input gates provides a simple and efficient input buffer. In the input buffer circuit, a chip select signal is applied in inverted form to the NOR gate and in non-invented form to the NAND gate. The resulting input buffer is both simpler and faster than earlier circuits.

3 Claims, 1 Drawing Sheet

INTEGRATED CIRCUIT INCLUDING AN INPUT BUFFER CIRCUIT HAVING NAND AND NOR GATES

BACKGROUND OF THE INVENTION

The invention relates to an integrated circuit including an input buffer circuit for generating an inverted and a non-inverted logic output signal in dependence on an input signal switching between a first and a second voltage, having a first and a second input gate, each having an input for receiving the input signal and an input for receiving a signal derived from a chip select signal, and each having an output for providing a first and a second intermediate signal, further including a first and a second amplifier circuit for converting the intermediate signals into the logic output signals.

Such an integrated circuit is disclosed in the U.S. Pat. No. 4,807,198, which describes an integrated circuit in which the input signal and the chip select signal are applied to two input NOR gates, whose outputs are each connected via a hysteresis circuit to cross-wise coupled NAND gates, which form a latch. The two data paths thus formed have different switching points which cause, when the input signal increases or decreases, the output signal present to be deselected before the new output signal is selected. The different switching points of the data paths are realized by a suitable dimensioning of the relevant transistors of the input gates and hysteresis circuits. The process spread which is unavoidably caused during production results in unwanted inaccuracies.

SUMMARY OF THE INVENTION

The invention has inter alia for its object to provide an integrated circuit including a simpler input buffer circuit in which the different switching points of the data paths can be realized in an easier manner, and in which the chip select signal is faster. To that end, an integrated circuit according to the invention, is characterized, in that, the first input gate is a NAND gate and the second input gate is a NOR gate, the input buffer circuit further including means for applying in the inverted form the chip select signal to the NOR-gate and for applying in the non-inverted form the chip select signal to the NAND gate.

In essence, the invention is based on the recognition that with a substantially equal dimensioning of the transistors in CMOS a NAND gate has a higher switching point than a NOR gate. This is caused by the fact that the series-arranged n-channel transistors of a NAND gate provide a pull-down which is weaker than the pull-up provided by the p-channel transistors which are not arranged in series. For a NOR gate the opposite holds: the pull-down is stronger, so the switching point is lower. Thus, in a simple manner the necessity of a suitable dimensioning of a large number of transistors is obviated.

In an embodiment, an integrated circuit of the invention, is characterized in that, it includes a further input buffer circuit whose input signal is an external chip select signal CSE and whose chip select signal is an external supply voltage field Vdd, the output of the further input buffer circuit being applied as the chip select signal to the input buffer circuit. In this way the external chip select signal is converted into an internal (CMOS) chip select signal.

In a further embodiment an integrated circuit in accordance with the invention is characterized in that, it includes a memory circuit and has a plurality of input buffer circuits, the relevant input signals being address signals. In a memory-IC it is advantageous that, by using the inverter before the NOR gate the capacitive load of the chip select signal is decreased, as a result of which this signal becomes faster.

BRIEF DESCRIPTION OF DRAWING

The invention will now be described in greater detail on the basis of embodiments and with reference to the accompanying drawings, in which.

DESCRIPTION OF THE PREFERRED EMBODIMENTS

Figure 1:
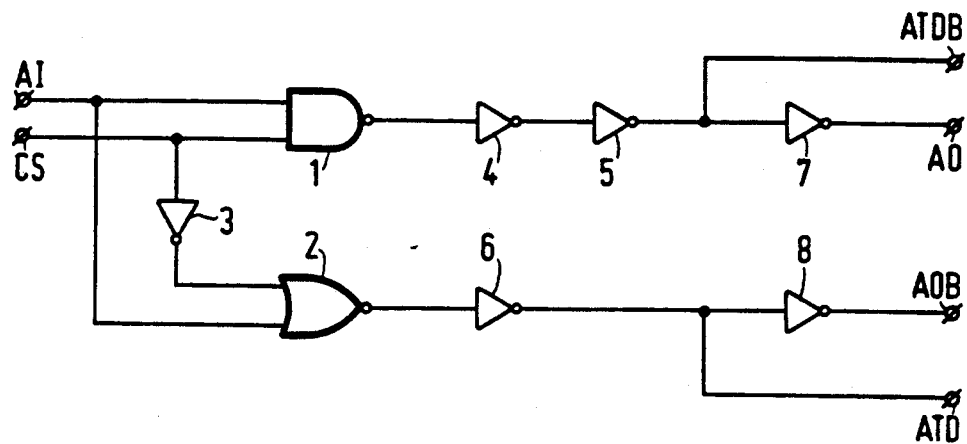
FIG. 1 shows an input buffer circuit in accordance with the invention.

In FIG. 1 an input signal AI is connected to a full CMOS NAND gate 1 and to a full CMOS NOR gate 2. The input signal AI is, for example, a TTL data or address signal, switching between, for example, 0.4 V (low) and 2.4 V (high), and which is to be converted into a CMOS data or address signal, having a high level of 5 V and a low level of 0 V. A chip select signal CS is connected, in the non-inverted state, to NAND gate 1 and in the inverted state to NOR gate 2, by means of a standard CMOS inverter 3. The chip select signal CS is a CMOS signal which reduces the current consumption when that portion of the integrated circuit to which the signal is applied, in this case the input buffer circuit, is not used. The output of NAND gate 1 is connected to inverter 5, whose output supplies an inverted address-transition-detection signal ATDB and is also connected to inverter 7, whose output supplies the output signal A0. The output of NOR gate 2 is connected to inverter 6, whose output supplies an address-transition-detection signal ATD and is also connected to inverter 8, whose output supplies the inverted output signal A0B. The inverters 4, 5 and 7 together form a first amplifier circuit which amplifies the intermediate signal supplied by the NAND gate into the non-inverted output signal A0, while the inverters 6 and 8 together form a second amplifier circuit which amplifies the intermediate signal supplied by NOR gate 2 into the inverted output signal A0B.

When the chip select signal CS is high, and input signal AI is high, then output signal A0 is high, inverted output signal A0B is low, signal ATD is high and signal ATDB is low. When chip select signal CS is high, and input signal AI is low, then output signal A0 is low, inverted output signal A0B is high, signal ATD is low and signal ATDB is high. When chip select signal CS is low, then output signal A0 is low, inverted output signal A0B is low, signal ATD is high and signal ATDB is high.

The NAND gate 1 has a pull-up, because of its non-series arranged p-channel transistors, which is greater than the pull-down because of its series-arranged n-channel transistors. The NOR gate 2 has a pull-down, because of its non-series arranged n-channel transistors which is greater than the pull-up provided by its series-arranged p-channel transistors. As a result thereof, NAND gate 1 has a higher switching point than NOR gate 2. With a high chip select signal CS a transition from high to low of the input signal AI results in that first the available output signal A0 is deselected (the NAND gate 1 switches first). The non-inverted output signal A0 and the inverted output signal A0B are then both temporarily in the low state. Thereafter the new output signal is selected (the NOR gate 2 switches over): A0B goes high. At a transition from low to high of the input signal AI deselection again occurs first: A0B becomes low. Thereafter the new output signal is selected: A0 becomes high. Also in this case A0 and A0B are temporarily both low. By realizing this early deselection in the input buffer circuit, this deselection needs not to be taken into account in the design of the rest of the integrated circuit. Consequently, a chip designer can optimize in, for example, a design of a precoder, the rate of the selection.

The speed of the chip select signal CS is important for a fast access of the integrated circuit portion driven thereby. With the prior art input buffer circuit both input gates are driven by signal CS, so that the signal CS is capacitively loaded twice. In the input buffer circuit of the invention however the inverter 3 precedes the NOR gate 2, which inverter capacitively loads the signal 5 to 10 times less than the load produced by the gates which were to be driven in the NOR gate 2 by signal CS. The signal CS is capacitively loaded to a far less extent and consequently becomes faster. Because of the choice of the number of inverters in the amplifier circuits the two paths through the input buffer circuit are of equal lengths in the signal CS. As described in the foregoing, output signals A0 and A0B are both low in response to a change in the input signal AI and also when the chip select signal CS is low. This fact can be utilized in the rest of the integrated circuit, since in an integrated circuit the same actions are often performed at a change in the input signal and at the deselection of a portion of the circuit (by changing CS to the low state).

The hysteresis circuits in the prior art input buffer circuit slow the circuit down and consume current. In addition, the transistors forming the circuit, in combination with the transistors of the input NOR gates must be suitably dimensioned to ensure the correct switching points. In an input buffer circuit of the invention hysteresis circuits are superfluous because of the use of different switching points of the input gates.

When the input buffer circuit supplies ATD and ATDB signals for an address-transition-detection-circuit, these signals may already be supplied at an earlier stage (more specifically after inverters 5 and 6) than the output signals (after inverters 7 and 8), since they need to be amplified to a less extent. With a change in the input signal AI, ATD and ATDB become both temporarily high. Also when chip select signal CS is low, ATD and ATDB both are temporarily switched to the high state. Also this fact can be utilized in the rest of the integrated circuit, for the same reasons as outlined above.

Figure 2:
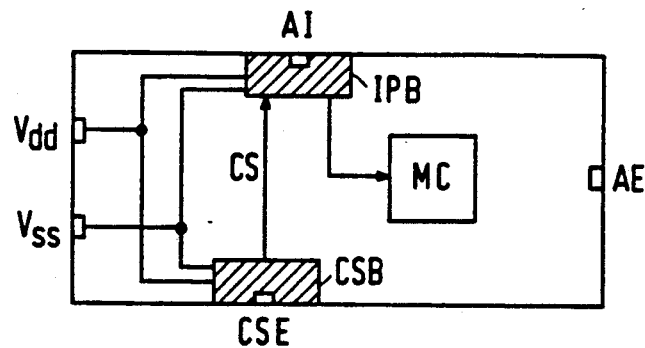
FIG. 2 shows an integrated circuit including an input buffer circuit in accordance with the invention.

FIG. 2 shows an integrated circuit including an input buffer circuit in accordance with the invention. Vdd and Vss are the external power supply terminals. The circuit includes a memory circuit MC and comprises several input buffer circuits, only one of which is shown for the sake of clarity: IPB. The input signals of the different input buffer circuits are address signals. AI is an external address signal, which in input buffer circuit IPB is converted into an internal address signal, which is further processed in the memory circuit MC. Optionally, there is an external output signal AE. The conversion is effected under the control of internal chip select signal CS, which is, for example, generated from external chip select signnal CSE by a further input buffer circuit CSB, of the same type as IPB, having input signals CSE instead of AI (at IPB) and Vdd instead of CS (at IPB).

We claim:

1. An integrated circuit including an input buffer circuit for generating an inverted logic output signal and a non-inverted logic output signal in dependence on an input signal switching between a first and a second voltage, having a first and a second input gate, each having an input for receiving the input signal and an input for receiving a signal derived from a chip select signal, and each having an output for providing a first and a second intermediate signal, further including a first and a second amplifier circuit, each having an input coupled to the output of said first and second input gate, respectively, for converting the intermediate signals into the logic output signal of said input buffer circuit, characterized in that the first input gate is a NAND gate and the second input gate is a NOR gate, the input buffer circuit further including means for applying, in the inverted form, the chip select signal to the NOR-gate and for applying, in the non-inverted form, the chip select signal to the NAND gate.

2. An integrated circuit as claimed in claim 1, characterized in that it includes a further input buffer circuit whose input signal is an external chip select signal CSE and whose chip select signal is an external supply voltage field Vdd, the output of the further input buffer circuit being applied as the chip select signal to the input buffer circuit.

3. An integrated circuit as claimed in claim 1, characterized in that, it includes a memory circuit and has a plurality of input buffer circuits, the relevant input signals being address signals.

* * * * *